(12) United States Patent
Sung et al.

(10) Patent No.: US 11,742,407 B2
(45) Date of Patent: Aug. 29, 2023

(54) MULTILAYER HIGH-K GATE DIELECTRIC FOR A HIGH PERFORMANCE LOGIC TRANSISTOR

(71) Applicant: Intel Corporation, Santa Clara, CA (US)

(72) Inventors: Seung Hoon Sung, Portland, OR (US); Ashish Verma Penumatcha, Beaverton, OR (US); Sou-Chi Chang, Portland, OR (US); Devin Merrill, McMinnville, OR (US); I-Cheng Tung, Hillsboro, OR (US); Nazila Haratipour, Hillsboro, OR (US); Jack T. Kavalieros, Portland, OR (US); Ian A. Young, Portland, OR (US); Matthew V. Metz, Portland, OR (US); Uygar E. Avci, Portland, OR (US); Chia-Ching Lin, Portland, OR (US); Owen Loh, Portland, OR (US); Shriram Shivaraman, Hillsboro, OR (US); Eric Charles Mattson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 741 days.

(21) Appl. No.: 16/700,757

(22) Filed: Dec. 2, 2019

(65) Prior Publication Data

US 2021/0167182 A1 Jun. 3, 2021

(51) Int. Cl.
*H01L 29/51* (2006.01)
*H01L 21/8234* (2006.01)
(Continued)

(52) U.S. Cl.
CPC .... *H01L 29/512* (2013.01); *H01L 21/823431* (2013.01); *H01L 27/0886* (2013.01);
(Continued)

(58) Field of Classification Search
CPC ... H01L 29/785; H01L 29/512; H01L 29/513; H01L 21/823431; H01L 27/1159; H01L 29/66795; H01L 29/42392
See application file for complete search history.

(56) References Cited

U.S. PATENT DOCUMENTS 9,853,150 B1 * 12/2017 Colinge .............. H01L 27/1159
2009/0004881 A1 1/2009 Chen
(Continued)

OTHER PUBLICATIONS

Search Report from European Patent Application No. 20198182.6, dated Mar. 10, 2021, 13 pgs.

*Primary Examiner* — Changhyun Yi
(74) *Attorney, Agent, or Firm* — Schwabe, Williamson & Wyatt, P.C.

(57) ABSTRACT

A integrated circuit structure comprises a fin extending from a substrate. The fin comprises source and drain regions and a channel region between the source and drain regions. A multilayer high-k gate dielectric stack comprises at least a first high-k material and a second high-k material, the first high-k material extending conformally over the fin over the channel region, and the second high-k material conformal to the first high-k material, wherein either the first high-k material or the second high-k material has a modified material property different from the other high-k material, wherein the modified material property comprises at least one of ferroelectricity, crystalline phase, texturing, ordering orientation of the crystalline phase or texturing to a specific crystalline direction or plane, strain, surface roughness, and lattice constant and combinations thereof. A gate electrode ix over and on a topmost high-k material in the multilayer high-k gate dielectric stack. A selector element is above the metal layer.

11 Claims, 12 Drawing Sheets

(51) Int. Cl.
*H01L 27/088* (2006.01)
*H01L 29/423* (2006.01)
*H01L 29/66* (2006.01)
*H01L 29/78* (2006.01)

(52) U.S. Cl.
CPC ...... *H01L 29/42392* (2013.01); *H01L 29/517* (2013.01); *H01L 29/66795* (2013.01); *H01L 29/7851* (2013.01)

(56) References Cited

U.S. PATENT DOCUMENTS

| | | |
|---|---|---|
| 2015/0287802 A1 | 10/2015 | Lee |
| 2019/0131382 A1 | 5/2019 | Lu |
| 2019/0207009 A1 | 7/2019 | Yamaguchi |
| 2019/0237464 A1 | 8/2019 | Ching |

* cited by examiner

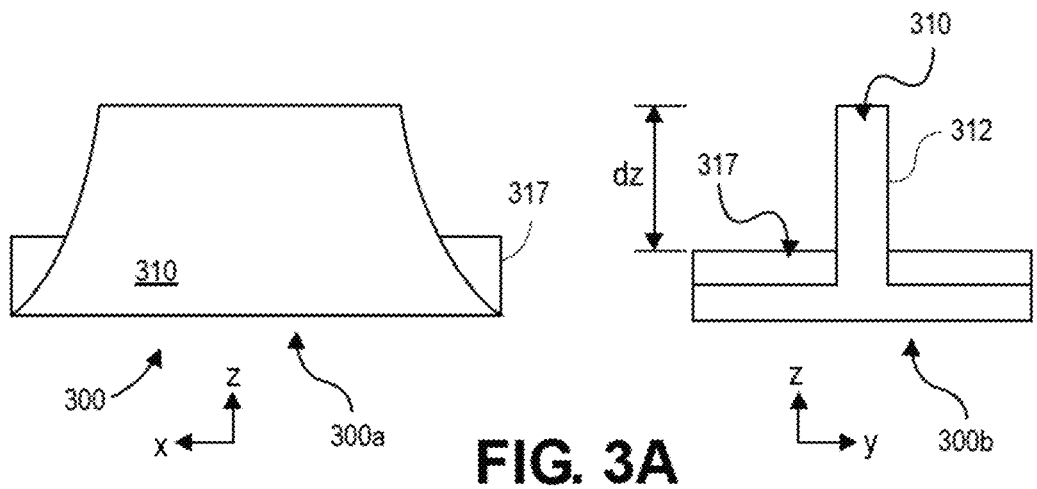
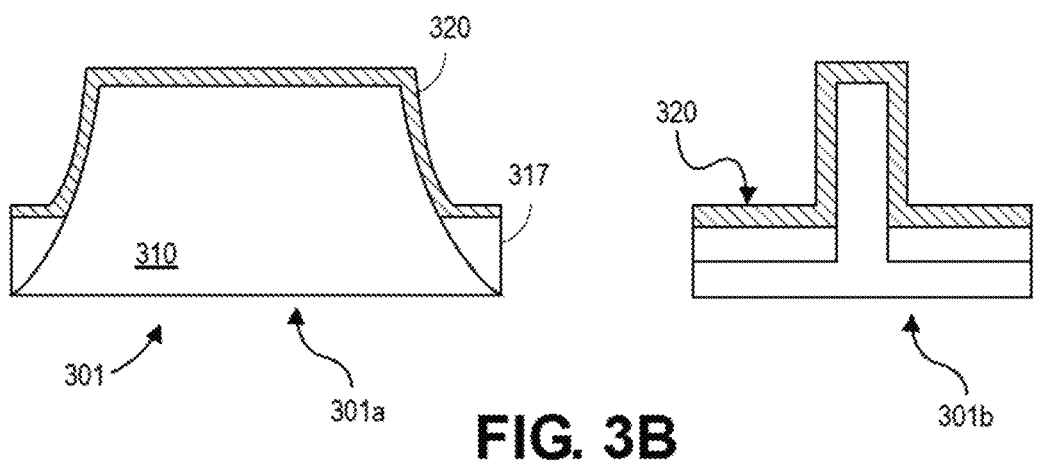
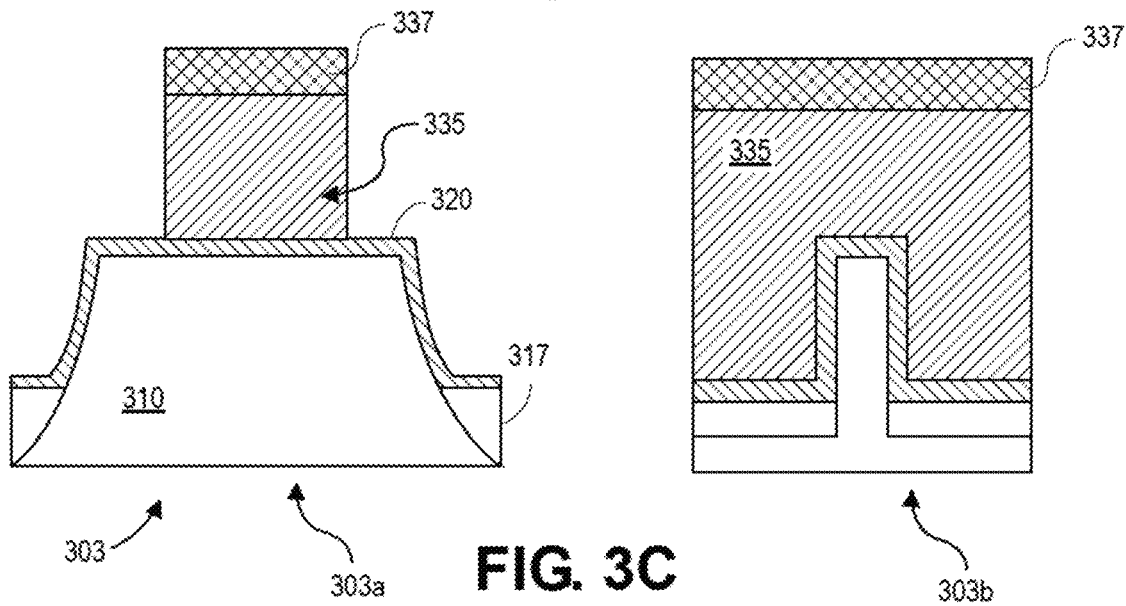
FIG. 3A
FIG. 3B
FIG. 3C

MULTILAYER HIGH-K GATE DIELECTRIC FOR A HIGH PERFORMANCE LOGIC TRANSISTOR

TECHNICAL FIELD

Embodiments of the disclosure are in the field of integrated circuit structures and, in particular, a multilayer high-k gate dielectric for a high performance logic transistor.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and state-of-the-art fabrication processes may limit the possibility to further extend them into the sub-10 nm range. Consequently, fabrication of the functional components needed for future technology nodes may require the introduction of new methodologies or the integration of new technologies in current fabrication processes or in place of current fabrication processes.

For example, in a FinFET, a type of non-planar transistor built around a thin strip of semiconductor material referred to as a fin, a gate oxide is a dielectric/insulating layer that separates the gate terminal of the transistor from the underlying source and drain terminals. An inversion layer is formed in the semiconductor substrate via capacitive coupling when a gate bias is applied. The inversion layer provides a channel through which current can pass between source and drain terminals. Conventional gate oxide scaling has limits that may also limit the inversion charge while meeting all the requirement in the reliability.

BRIEF DESCRIPTION OF THE DRAWINGS

FIGS. 3A-3I illustrate cross-sectional views are shown for respective of processing to fabricate an IC device (configured to provide transistor functionality) having a multilayer high-k gate stack extending under a gate structure and over an existing semiconductor fin structure.

DESCRIPTION OF THE EMBODIMENTS

Figure 1:
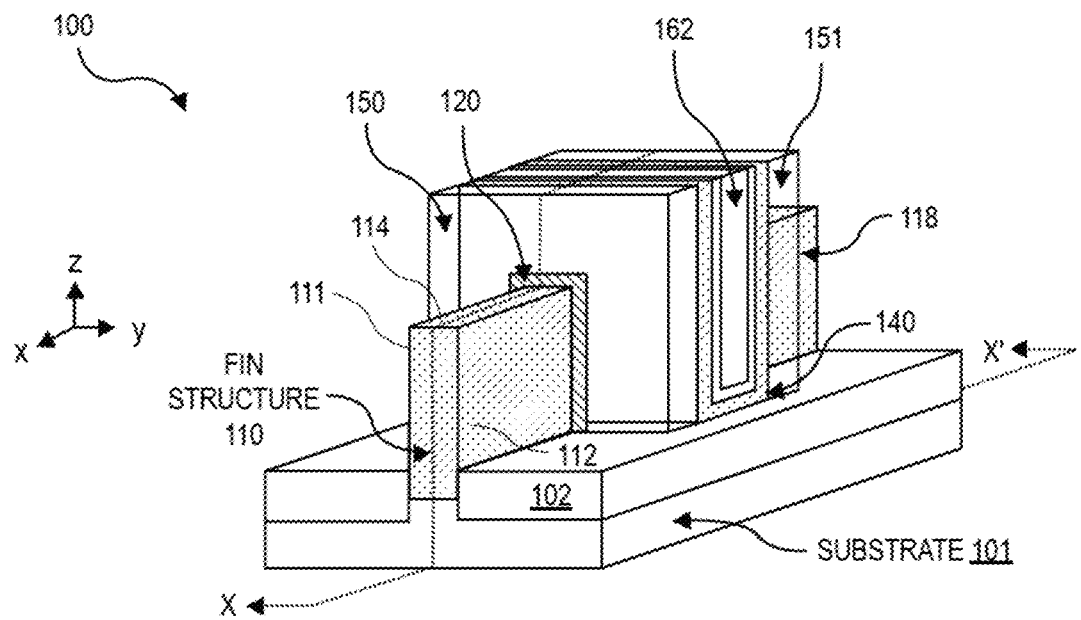
FIG. 1 shows one example of a portion of an IC device consistent with the present disclosure, in this case a portion of a FinFET.

A multilayer high-k gate dielectric for a high performance logic transistor are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to structures and architectures for fabricating a multilayer high-k gate dielectric for a high performance logic transistor, such as a FinFET or gate-all-around FET. One or more embodiments described herein are further directed to structures and architectures for fabricating an integrated circuit that utilizes SOI template formation while maintaining the capability of multi-layer high k, enabling high performing & low-leakage transistors. Embodiments may include or pertain to one or more of transistors, semiconducting oxide materials, and system-on-chip (SoC) technologies of future technology nodes.

To provide context, a FinFET is one type of non-planar transistor which is built around a thin strip of semiconductor material (referred to as the "fin"). The transistor includes the standard field effect transistor (FET) nodes/components: a gate, a gate dielectric, a source region, and a drain region. During operation, a conductive channel of the device resides on the outer sides of the fin beneath the gate dielectric. Specifically, current runs along "sidewalls" of the fin as well as along the top side of the fin. Because the conductive channel essentially resides along the three different outer, planar regions of the fin, such a FinFET is typically referred to as a "tri-gate" FinFET. Other types of FinFETs exist (such as "double-gate" FinFETs in which the conductive channel principally resides only along both sidewalls of the fin and not along the top side of the fin).

Typically, fabricating a non-planar transistor includes depositing a dielectric material into a given space to form a gate dielectric or oxide to provide at least some electrical insulation between two adjoining structures, e.g., a fin and a gate. A common material for a gate dielectric is silicon dioxide, which has a dielectric constant around 3.8. However, as improvements to semiconductor fabrication processing continue to reduce the size of transistor structures, limits are placed on gate oxide thickness scaling. As a result, there is expected to be a growing premium placed on incremental improvements to techniques for overcoming the limits of gate oxide thickness scaling and the inversion charge of a conventional gate oxide, while maintaining low gate leakage.

In accordance with a first aspect of the disclosed embodiments, a non-planar transistor is fabricated with a multilayer oxide using high-k gate materials and an amorphous layer and/or a crystalline layer, thus enabling a higher inversion charge. In accordance with a second aspect of the disclosed embodiments, a non-planar transistor is fabricated with a buried high-k material combined with a pseudo-SOI template. Non-planar transistors fabricated using such architectures may exhibit an increase in gate control, stability, and performance of thin film transistors. Applications of such systems may include, but are not limited to, back end (BEOL) logic, memory, or analog applications. Embodiments described herein may include non-planar structures that effectively increase gate oxide thickness scaling and inversion charge by integrating a multilayer gate dielectric in unique architectures. In one embodiment, high-k materials are used for the gate dielectric, where the high-k materials have a dielectric constant k greater than 7. In one embodiment, the non-planar transistor may comprise any type of multi-gate, nanowire, or nanoribbon device.

Referring now to the first aspect of the disclosed embodiments, an integrated circuit structure provides a multilayer high-k gate dielectric stack comprising at least a first high-k material and a second high-k material. The first high-k material extends conformally over a fin over a channel region, while the second high-k material is conformal to the first high-k material, wherein either the first high-k material or the second high-k material has a modified material property different from the other high-k material, where the modified material property comprises at least one of ferroelectricity, crystalline phase, texturing, ordering orientation of the crystalline phase or texturing to a specific crystalline direction or plane, strain, surface roughness, and lattice constant and combinations thereof. A metal gate material is over and on a top most high-k material of the multilayer high-k gate dielectric stack. In embodiments, the modified material property may include different crystalline phases, including crystalline, polycrystalline, nanocrystalline, and amorphous. In embodiments, the modified strained property may originate from an annealing process or other heat treatment, and extra sequences of sacrificial material deposition and etching, which alters the physical and sometimes chemical properties of a material.

FIG. 1 shows one example of a portion of an IC device 100 consistent with the present disclosure, in this case a portion of a FinFET. As shown, IC device 100 includes a substrate 101, a trench dielectric 102 on substrate 101, and a fin structure 110 disposed in a trench which is formed by trench dielectric 102. Fin structure 110 comprises, for example, a top surface 114 and a pair of laterally opposite sidewalls (sidewall 111 and opposing sidewall 112, respectively). In some embodiments, portions of fin structure 110 which are vertically offset from one another comprise different respective group III-V (and/or other) semiconductor materials.

Substrate 101 is formed of any of a variety of materials that are suitable for use as a substrate of a semiconductor device, and in particular as a substrate for non-planar transistors such as FinFETS and multi-gate transistors. Non-limiting examples of such suitable materials include silicon (Si), germanium (Ge), silicon-germanium (SiGe), silicon-carbide (SiC), sapphire, a group III-V semiconductor, a silicon on insulate (SOI) substrate, combinations thereof, and the like. Without limitation, in some embodiments substrate 101 is formed from or includes single crystal silicon.

In some embodiments the non-planar semiconductor device includes at least one trench that is formed on or within the substrate. In the embodiment of IC device 100, a trench (not separately labeled) is defined by the sidewalls of trench dielectric 102 (hereinafter, trench sidewalls) and an upper portion of substrate 101. The trench thus includes at least two opposing sides (trench sidewalls) and a bottom. A bottom of the trench is formed at least in part by an upper surface of the substrate, and/or one or more buffer and/or transition layers deposited on the substrate. A trench of any of a variety of suitable dimensions may be used, in different embodiments, according to implementation-specific details. Without limitation, in some embodiments the height (z-axis dimension) and width (y-axis dimension) of the trench enables the deposition of the materials used to form fin structure 110—e.g., via an aspect ratio trapping (ART) process. Accordingly, in some embodiments the width of the trench is in a range of 1 nanometers (nm) to 500 nanometers (nm), such as in a range of 1 nm to 300 nm, in a range of 1 nm to 100 nm, in a range of 5 nm to 100 nm, or even in a range of 5 nm to 30 nm. Likewise, the height of such a trench is range, for example, in a range of 1 nm to 500 nm, such as a range of 100 nm to 300 nm.

Trench dielectric 102, which may also comprise multiple layers, is formed from any of a variety of materials that are suitable for use as a trench dielectric material of a non-planar semiconductor device. Non-limiting examples of such materials include oxides, nitrides and alloys, such as but not limited to silicon oxide ($SiO_2$), silicon nitride (SiN), silicon oxycarbide (SiCO), silicon carbon oxynitride (SiCON), silicon carbonitride (SiCN), combinations thereof, and the like.

Figure 2:
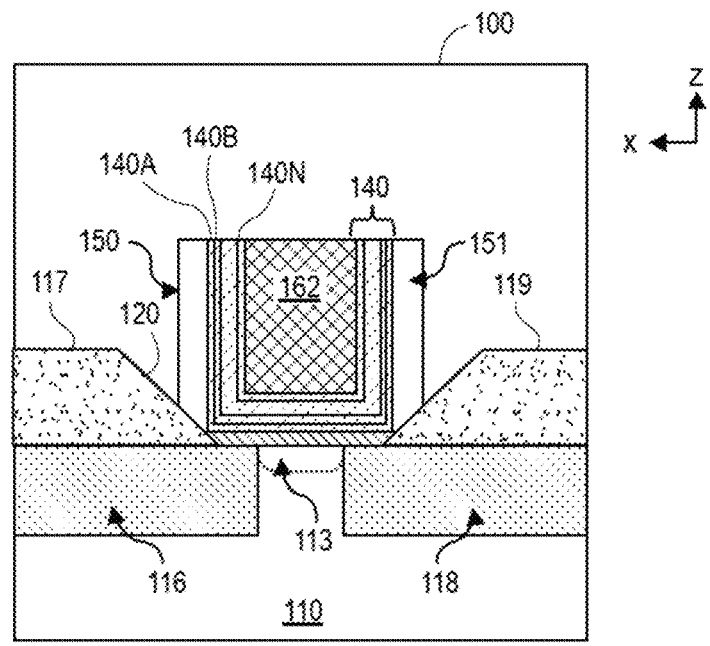
FIG. 2 shows a view of a cross-section X-X' of IC device 100.

FIG. 2 shows a view of a cross-section X-X' of IC device 100. A non-planar transistor of IC device 100 comprises structures which are variously disposed in or on fin structure 110. For example, such a non-planar transistor may include a channel region 113, two doped source or drain ("SD") structures 116, 118 at opposite ends of the channel region 113, and raised epitaxial (epi) source or drain regions 117, 119.

According to the first aspect of the disclosed embodiments, a gate structure of the non-planar transistor comprises gate electrode 162 and a multilayer high-k gate dielectric stack 140 comprising at least a first high-k material 140A and a second high-k material 140B up to an $n^{th}$ high-k material 140N. A gate electrode 162 is over and on a topmost high-k material in the multilayer high-k gate dielectric stack 140. More particularly, gate electrode 162 extends over and across a portion of fin 110 in a region between insulation spacers 150, 151, which are shown as transparent to further show features of IC device 100.

According to the first aspect of the present embodiment, either the first high-k material 140A or the second high-k material 140B has a modified material property different from the other high-k material, wherein the modified property comprises at least one of ferroelectricity, crystalline phase, texturing, ordering orientation of the crystalline phase or texturing to a specific crystalline direction or plane, strain, surface roughness, and lattice constant and combinations thereof. In embodiments, the crystalline phases, include crystalline, polycrystalline, nanocrystalline, and amorphous. For example, the second high-k material 140B comprises the same or different material as the first high-k material 140A, but the second high-k material 140B may have a different crystalline phase, strain, surface roughness, and/or lattice constant than the first high-k material 140A. A channel treatment may be employed to modify one or more properties of one or more of the high-k materials 140A to 140N. For example, annealing or surface texturing or an extra sequence of sacrificial material deposition and etching may be used to modify the strain of one or more of the high-k materials 140A to 140N.

In an embodiment, operation of IC device 100 includes selectively controlling a current between source or drain regions 116, 118 via channel region 113, by applying a voltage to gate electrode 162. This functionality is enabled in part by dielectric structures which provide electrical insulation between gate electrode 162 and channel region 113. Due to the interaction between the high-k materials 140A to 140N having different modified properties, the transistor provides a higher current. For example, different materials and dopants, or doping profile, material profile, strain and templating of each layer provides different growth characteristics in each distinct layer and in the whole stack, enabling higher inversion charge through the whole multilayer high-k gate dielectric stack 140. The result is a higher charge may be introduced into the channel 113 and higher current may be achieved for the transistor for higher performance.

In some embodiments, gate electrode 162 includes a metal with a work function below 5 eV. The metal gate electrode 162 includes, for example, an elemental metal layer, a metal alloy layer, or laminate structure of either or both. In some embodiments the gate electrode 162 may comprise a metal nitride, such as TiN (e.g., 4.0-4.7 eV). The gate electrode 162 may also comprise Al (e.g., TiAlN). Other alloy constituents may also be employed, such as, but not limited to C, Ta, W, Pt, and Zn.

In one embodiment, the multilayer high-k gate dielectric stack 140 may optionally include an optional underlayer gate dielectric 120 that extends conformally over the fin over the channel region under the multilayer high-k gate dielectric stack. In one embodiment, the underlayer gate dielectric 120 has a dielectric constant less than the dielectric constant of the materials comprising the multilayer high-k gate dielectric stack 140. The underlayer gate dielectric 120 and the multilayer high-k gate dielectric stack 140 provide electrical insulation between gate electrode 162 and each of a top of the channel structure and opposite vertical sidewalls of the channel structure. The presence of underlayer gate dielectric 120, however, may preserve channel mobility by mitigating scattering from higher k material resulting from the use of higher-k materials as gate dielectrics.

In the example embodiment shown, the underlayer dielectric 120 adjoins, and is conformal to, respective portions of the fin 110 sidewalls 111, 112 and top surface 114. In one embodiment, the underlayer dielectric 120 extends past the boundaries of the spacers 150 and 151. However, in the embodiment shown, the underlayer dielectric 120 is present on the fin 110 only within the boundaries of the spacers 150 and 151.

The multilayer high-k gate dielectric stack 140 comprises at least two high-k material layers. The first high-k material 140A extends conformally over the fin over the channel region (and over the underlayer gate dielectric 120 if present), the second high-k material 140B is conformal to the first high-k material 140A, the next high-k material is conformal to the second high-k material 140B, and so on. Thus, the multilayer high-k gate dielectric stack 140 includes portions that variously extend each between gate electrode 162, a top of underlayer dielectric 120, and respective inner sidewalls of insulation spacers 150 and 151. It is noted that underlayer dielectric 120 is not conformal to the sides of insulation spacer 150, 151.

Generally, a method for fabricating an IC device configured with transistor functionality may include forming a fin that extends up from a substrate, the fin comprising source and drain regions, and a channel region between the source and drain regions. A multilayer high-k gate dielectric stack is formed comprising at least a first high-k material and a second high-k material, the first high-k material extending conformally over the fin over the channel region, and the second high-k material conformal to the first high-k material, wherein either the first high-k material or the second high-k material has a modified property different from the other high-k material. In embodiments, the modified property comprises at least one of crystalline phase, strain, surface roughness, and lattice constant. A gate electrode is formed over and on a topmost high-k material in the multilayer high-k gate dielectric stack. Any of a variety of additional or alternative structures may be fabricated in different embodiments.

FIGS. 3A-3I illustrate cross-sectional views are shown for respective stages 300-308 of processing to fabricate an IC device (configured to provide transistor functionality) having a multilayer high-k gate stack extending under a gate structure and over an existing semiconductor fin structure. For each of stages 300-308, FIGS. 3A-3I show respective median (y-z plane) cross-sectional views 300a-308a and respective transverse (x-z plane) cross-sectional views 300b-308b.

FIG. 3A shows the process after stage 300 in which a fin structure (such as the illustrative fin 310 shown) is formed extending through a trench which is formed at least in part by a trench dielectric 317. Fin 310 includes some or all of the features of fin structure 110, for example. In an embodiment, fin 310 comprises one or more semiconductor materials and forms side surfaces including, for example, the illustrative side 312 shown. Side 312 has a vertical (z-axis) span "dz" which extends at least between a top of fin 310 and a horizontal surface, such as that of trench dielectric 317. In an example embodiment, such a vertical span is in a range of 10 nm to 200 nm. However, such dimensions may vary according to implementation-specific details, in different embodiments. The formation of fin 310 and trench dielectric 317 include operations that are adapted, for example, from conventional techniques for fabricating finFET transistors.

FIG. 3B shows the process after stage 301 in which a dielectric layer 320 is formed to extend, e.g., along the x-axis dimension shown—across and over at least a portion of fin 310. Dielectric layer 320 may correspond to underlayer gate dielectric 120, for example. At least a portion of dielectric layer 320 is to serve as a structure to promote electrical insulation in a transistor structure. At least a portion of dielectric layer 320—e.g., a portion which is adjacent to, and conformal with, some of fin 310—is to provide at least part of a gate dielectric structure. By way of illustration and not limitation, a material of the dielectric layer 320 comprises silicon and one of oxygen, nitrogen, or carbon—e.g., wherein the dielectric layer 320 material is one of silicon oxides ($SiO_2$), silicon oxynitrides (SiON), silicon nitrides (SiN), silicon carbonitrides (SiCN), carbon-doped oxide (SiOC), or combinations thereof. However, in other embodiments, dielectric layer 320 includes any of a variety of suitable materials that are adapted from convention techniques for providing electrical insulation for non-planar transistors. In some embodiments, an average thickness of the dielectric layer 320 is equal to or less than 40 Angstroms (Å) thick—e.g., in a range of 5 Å to 40 Å and, in some embodiments, in a range of 5 Å to 20 Å. However, such dimensions may vary according to implementation-specific details, in different embodiments. In an embodiment, formation of the dielectric layer 320 includes any of a variety of additive processes (such as chemical vapor deposition, atomic layer deposition or the like) adapted, for example, from conventional semiconductor fabrication techniques.

FIG. 3C shows the process after stage 303 in which in order to form spacers that may correspond to spacers 150, 151, a dummy (i.e., sacrificial) gate 335 is first formed over a portion of fin 310. A portion of fin 310 under dummy gate 335 provides a channel region 113 (FIG. 2) of a transistor structure (or other such IC device). Dummy gate 335 includes a layer of material such as polysilicon (e.g., doped, undoped, amorphous, crystalline or the like), or any of various suitable carbon or nitride based materials, for example. In an example embodiment, formation of dummy gate 335 includes forming a patterned resist or hard mask 337 on dielectric layer 320 and depositing a dummy gate material through the patterned resist mask. Any of a variety of known mask, patterning, deposition and/or etch methods and techniques can be used to form dummy gate 335, in various embodiments.

Figure 3D:
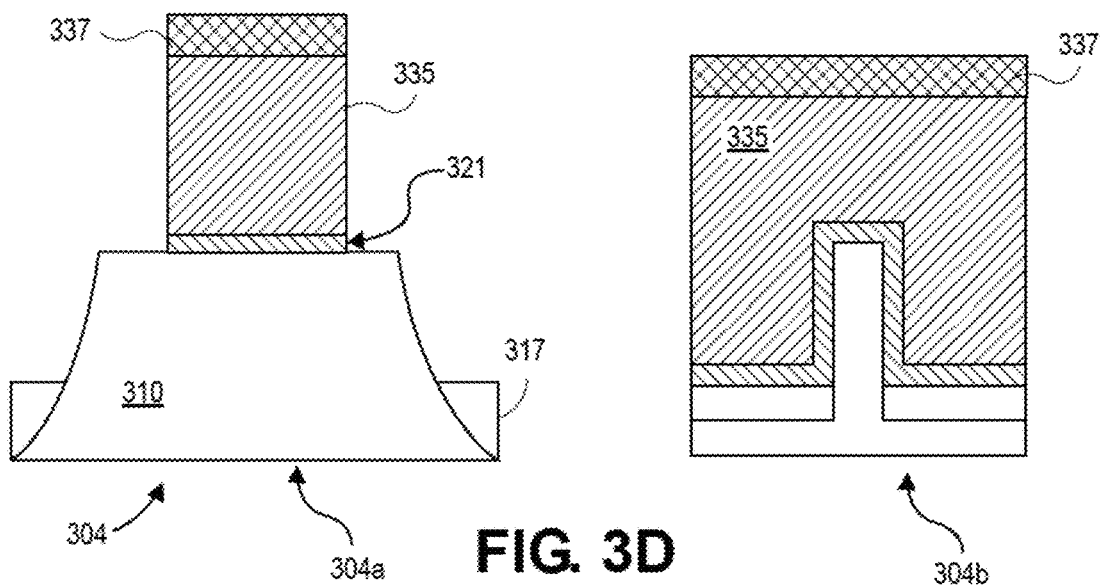

FIG. 3D shows the process after stage 304 in which etching and/or other subtractive processing is performed, e.g., with a patterned mask 337 to remove respective portions of dielectric layer 320 that is not under dummy gate 335. Such subtractive processing leaves portion 321 of dielectric layer 320 in this embodiment.

Figure 3E:
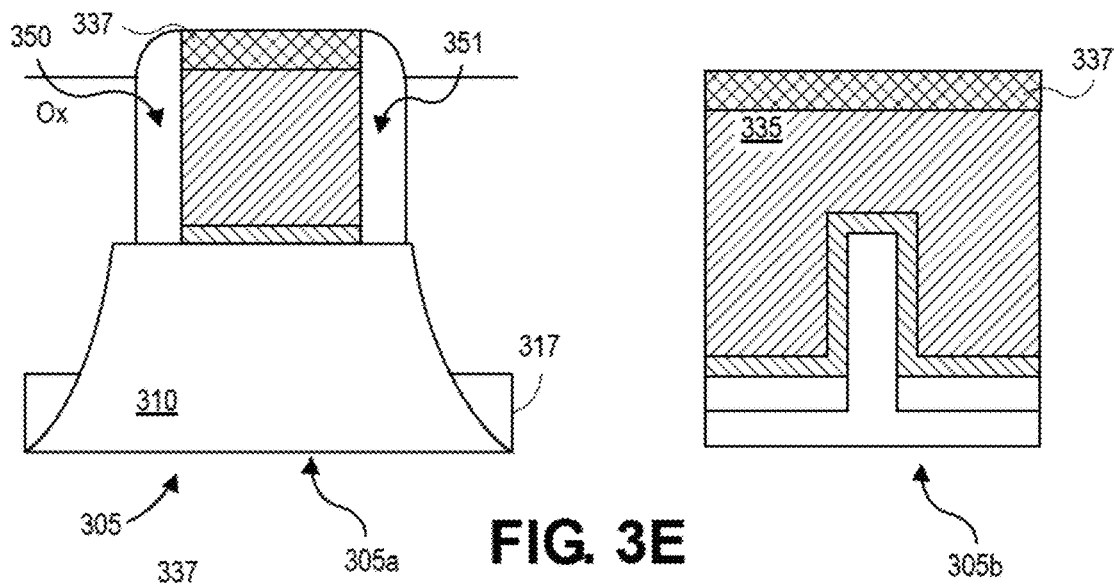

FIG. 3E shows the process after stage 305 in which spacers 350 and 351 are formed each at a respective opposite sidewall of dummy gate 335. Spacers 350 and 351 include features of insulation spacers 150 and 151 except where (for example) portions 321 abuts against, and does not extend under, spacer portions 350 and 351.

Figure 3F:
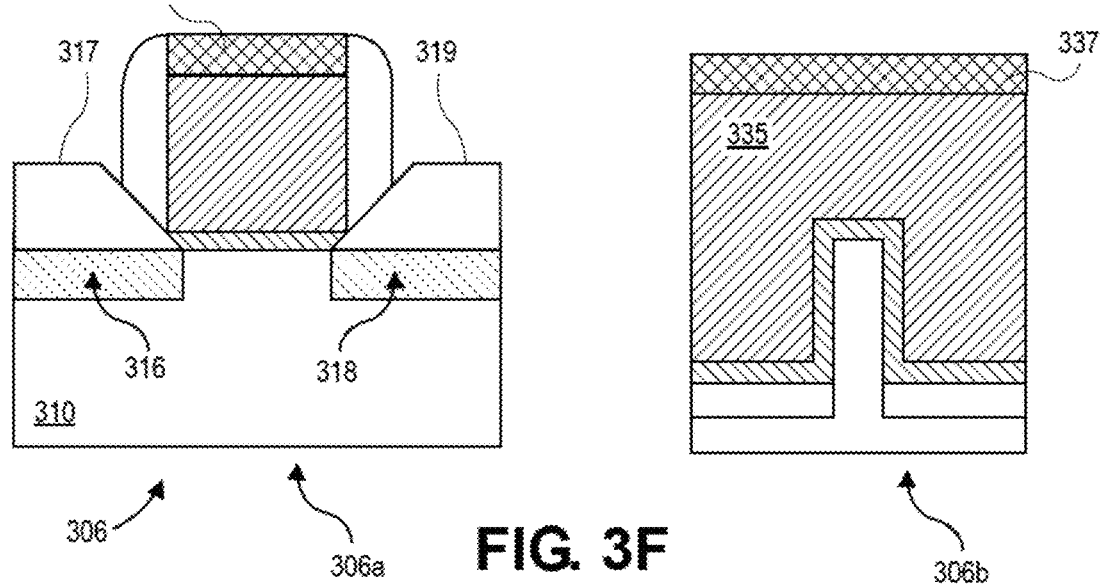

FIG. 3F shows the process after stage 306 in which doped source and drain regions 316 and 318 are formed in portions of fin 310 that are on opposite respective sides of channel region 113 (FIG. 2). Other transistor structures formed by the additional fabrication include raised epitaxial (epi) source or drain regions 317 and 319 each extending over a respective one of the doped source or drain regions 316, 318—source or drain contact structures (not shown), and/or the like. Such additional fabrication includes processes that, for example, are adapted from conventional mask, patterning, etching, deposition, doping, polishing, and/or other techniques.

Figure 3G:
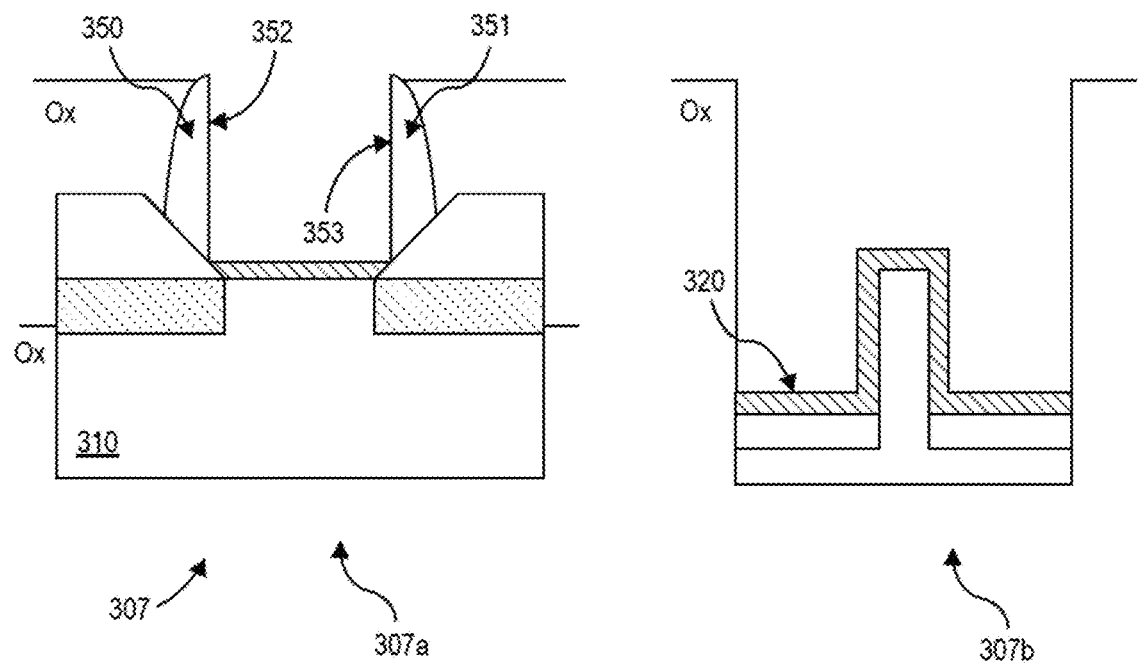

FIG. 3G shows the process after stage 307 in which dummy gate 335 is etched or otherwise removed. Removal of dummy gate 335 exposes respective side surfaces 352 and 353 of spacers 350 and 351. In some embodiments, etching to remove dummy gate 335 also removes a dummy oxide (if any) which was previously deposited on layer 320. Note, layer 320 is subsequently removed and then reformed. In embodiments, the dummy oxide and reformed dummy oxide may comprise $SiO_2$ or SiON for example.

Figure 3H:
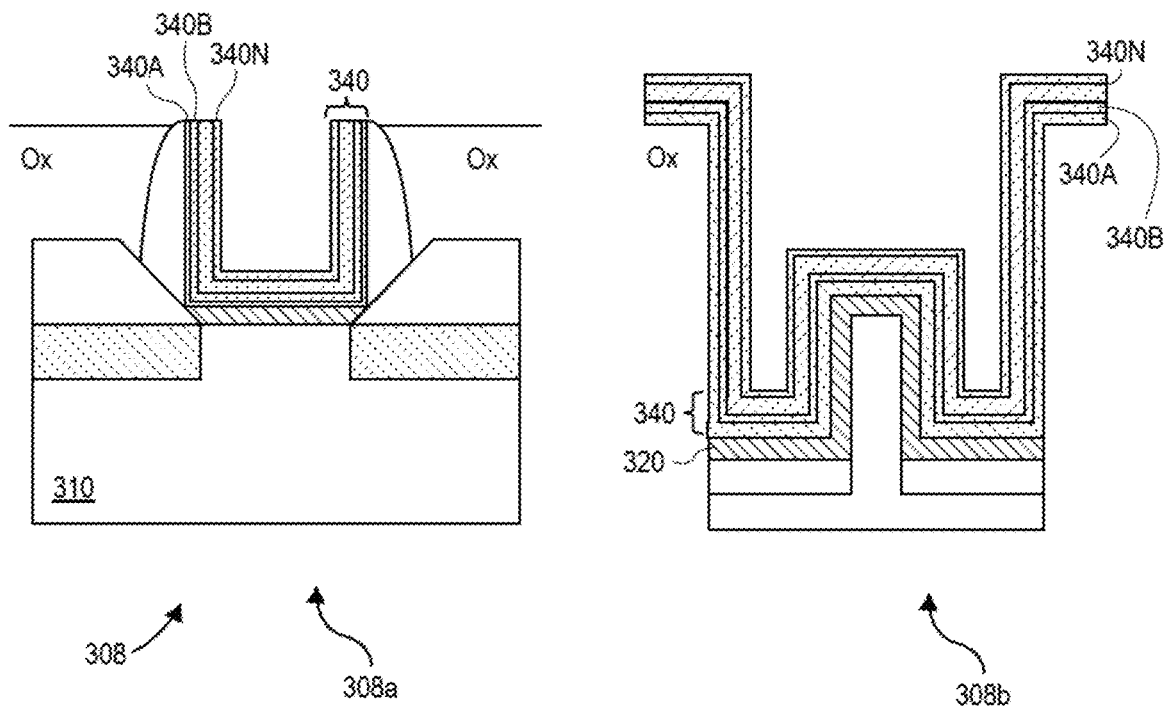

FIG. 3H shows the process after stage 308 in which a multilayer high-k gate dielectric stack 340 comprising at least a first high-k material 340A and a second high-k material 340B up to an $n^{th}$ high-k material 140N are sequentially formed. The first high-k material 340A extends across and over fin 310 in a region between spacers 350 and 351 such that the first high-k material 340A is adjacent and conformal to spacer sides 352 and 353 and dielectric layer 320. After first high-k material 340A is formed, each successive high-k material is conformal to the previous high-k material. One or more treatments (not shown) are performed to at least of the first high-k material layer such that one of the high-k materials has a modified property different from the other high-k materials, wherein the modified property comprises at least one of ferroelectricity, crystalline phase, strain, surface roughness, and lattice constant and combinations thereof.

Formation of the multilayer high-k gate dielectric stack 340 comprises deposition of dielectric materials that have a higher dielectric constant than that of dielectric layer 320. In embodiments, the high-k materials used to form multilayer high-k gate dielectric stack 340 comprise oxygen and a metal which, for example, includes, but is not limited to, one or more of aluminum (Al), tantalum (Ta), hafnium (Hf), zirconium (Zr), lanthanum (La), titanium (Ti) magnesium (Mg) or manganese (Mn). For example, in some embodiments, the second dielectric material includes hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof.

In various embodiments, the multilayer high-k gate dielectric stack 340 may be approximately 1 to 100 Å in thickness. The various high-k material layers may be the same or different thicknesses, with a minimum thickness of 0.5 Å each. For example, one high-k material layer may be 5 Å, while the next is 1 nanometer, and the like.

In some embodiments, fabrication of one or more of layers 320, multilayer high-k gate dielectric stack 340, and/or spacers 350 and 351 comprise one or more operations which, for example, are adapted from conventional semiconductor fabrication techniques such as mask, lithography, deposition (e.g., chemical vapor deposition), etching and/or other processes. Some of these conventional techniques are not detailed herein to avoid obscuring certain features of various embodiments.

Figure 3I:
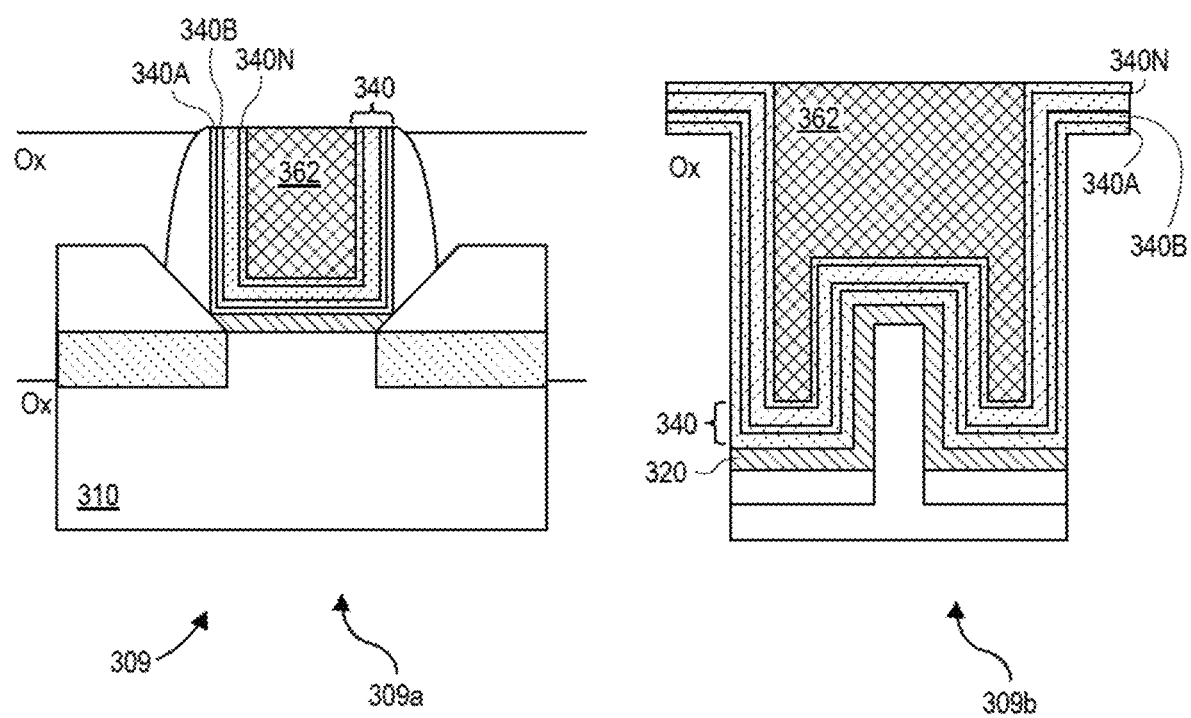

FIG. 3I shows the process after stage 309 in which a gate electrode structure 362 is formed on the multilayer high-k gate dielectric stack 340, e.g., using operations adapted from conventional metallization and/or other deposition techniques.

Figure 4A:
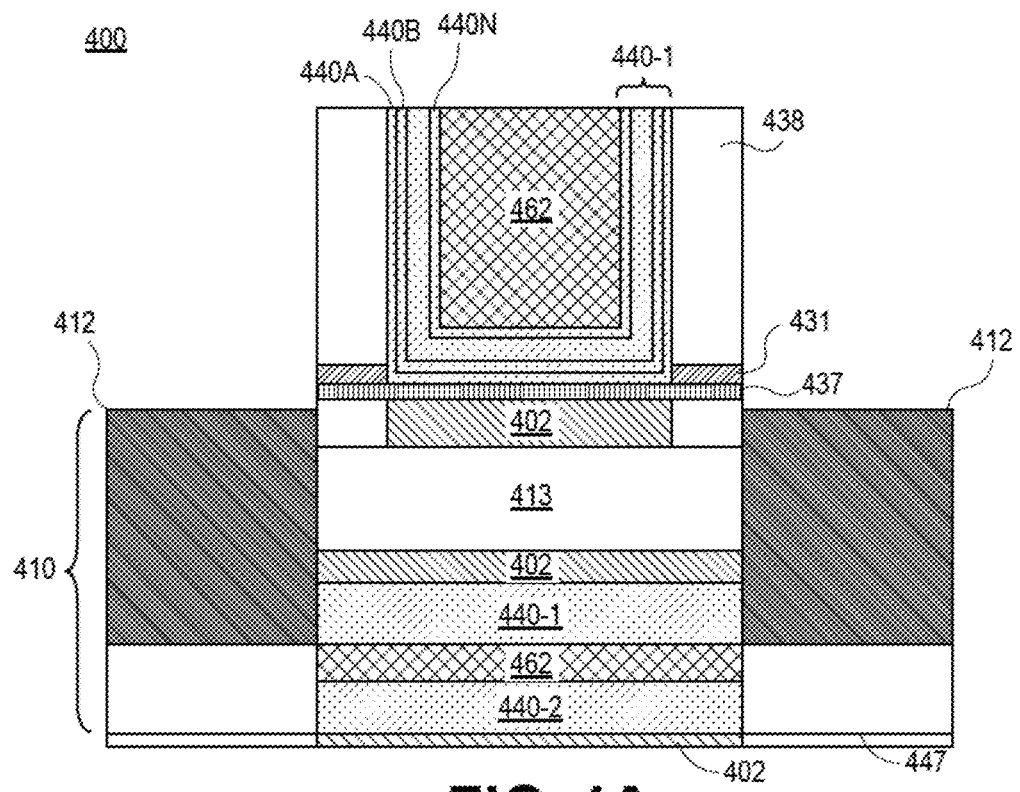
FIGS. 4A and 4B illustrate a pair of cross-sectional illustrations of a non-planar transistor is shown, in accordance with an embodiment.
Figure 4B:
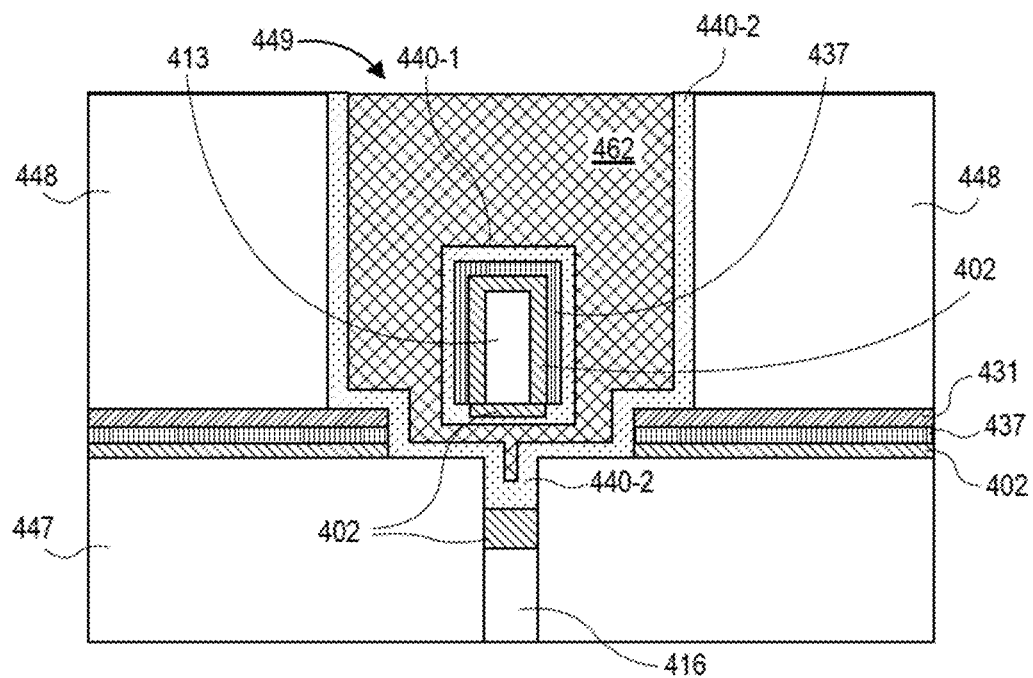

Referring now to the second aspect of the disclosed embodiments, an integrated circuit structure includes a multilayer high-k gate dielectric stack comprising at least a first high-k material and a second high-k material in combination with at least one low-k dielectric layer in a GAA (gate all around) architecture, and FIG. 4B provides a cross-sectional illustration of the non-planar transistor 400 across the channel region 413 of the fin 410. In an embodiment, the transistor 400 may be substantially similar to the IC device 100 described above with respect to FIGS. 1 and 2, with the exception that the transistor depicted is a GAA transistor.

In this embodiment, the transistor 400 comprises a fin 410 extending from a substrate (not shown), the fin 410 comprises a hanging fin region, which includes a channel region 413, S/D regions 448 on opposite sides of the channel region 413, and a sub-fin 416 region under the channel region 413 between the S/D regions 448, where the channel region 413 and the sub-fin region 416 are spaced apart. A first isolation region 447 is adjacent both sides the sub-fin region 416 beneath a second isolation region 448. The second isolation region 448 includes a trench 449 in which the channel region 413 is located.

In an embodiment, a gate dielectric stack comprises a dummy oxide 431, a low-k material 402, a first high-k material 437, a second high-k material comprising a first portion 440-1 and a second portion 440-2, and a gate electrode 462 between gate spacers 438. In an embodiment, one or both of the first high-k material 440-1 and the second high-k material 440-2 may comprise a multilayer high-k gate dielectric stack described above. For example, the first high-k material 437 may comprise a single layer or layers 440A, 440B to 440N.

Referring to FIG. 4B, according to the second aspect of the disclosed embodiments, the gate dielectric stack comprises the low-k material 402 conformal to a top surface of the first isolation region 447 and to sides and top of the channel region 413. The first high-k material 437 is conformal to the low-k material 402 over the first isolation region 447 and on sides and top of the channel region 413. The dummy oxide 431 is conformal to the first high-k material 437 over the first isolation region 447 and over the sides and top of the channel region 413.

The first portion 440-1 of the second high-k material is over the first high-k material 437 on all four sides of the channel region 413, and the second portion 440-2 of the second high-k material is conformal to a top surface of the second isolation region 448, conformal to sides and bottom of the trench 449, and conformal to a top of the sub-fin region 416.

The gate electrode 462 fills the trench 449 and surrounds a perimeter of the first portion 440-1 of the second high-k material over the channel region 413. For example, FIG. 4A shows a portion of the low-k material 402, the first portion 440-1 of the second high-k material, the gate electrode 462 and the second portion 440-2 of the second high-k material all below a bottommost surface of the channel region 413. In an embodiment, the second isolation layer 448 (e.g. an interlayer dielectric (ILD)) surrounds the gate stack and is positioned over a top surface of the S/D regions 412.

Referring to FIG. 4B, between the first isolation layer 447 and the second isolation layer 448, the low-k material 402 is shown conformal to the first isolation region 447, the first high-k material 437 is shown conformal to the low-k material 402, and the dummy oxide 431 is shown conformal to first high-k material 437. The low-k material 402, the first high-k material 437 and the dummy oxide 431 each abut the second portion 440-2 of the second high-k material at the bottom of the trench 449.

According to the second aspect of the disclosed embodiments, a transistor architecture comprising a hanging fin channel region spaced apart from a sub-fin region and a multilayer gate dielectric comprising a low-k material and two high-k materials may overcome the limit of inversion charge of conventional gate oxides by utilizing SOI template formation while maintaining the capability of multilayer high-k, and thus enabling high-performing and low-leakage transistors.

FIGS. 5A-5F illustrate cross-sectional fin cut views of a process for fabricating an IC device (configured to provide transistor functionality) having a hanging fin channel region spaced apart from a sub-fin region and a multilayer gate dielectric comprising a low-k material and a high-k material.

Figure 5A:
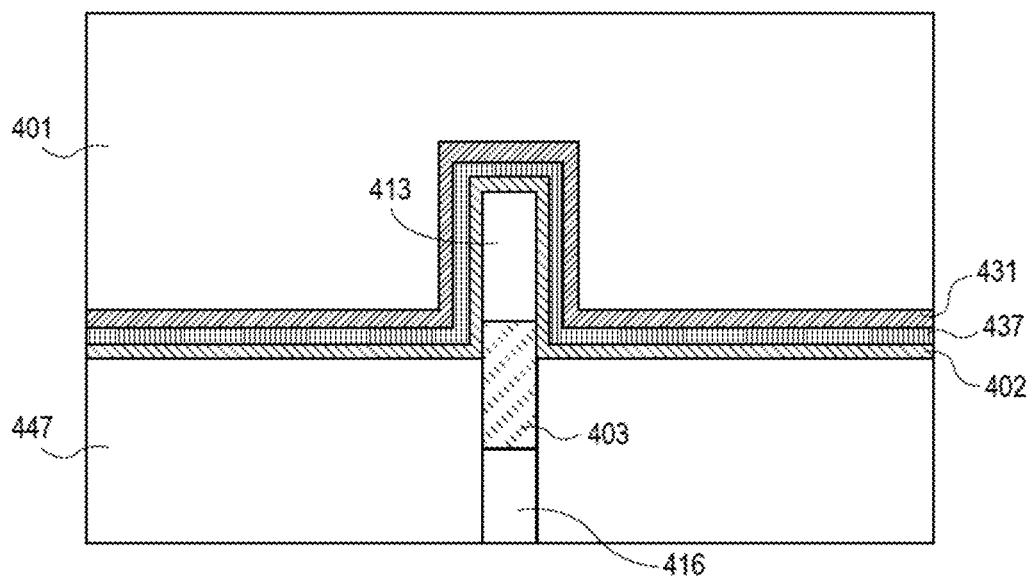
FIGS. 5A-5F illustrate cross-sectional fin cut views of a process for fabricating an IC device (configured to provide transistor functionality) having a hanging fin channel region spaced apart from a sub-fin region and a multilayer gate dielectric comprising a low-k material and a high-k material.

FIG. 5A illustrates the fabrication process after formation of a channel region 413 over a sub-fin region 416 of a fin, where a first isolation region 447 is on either side of the sub-fin. The sub-fin region 416 further includes a top sacrificial layer 403, such as $Si_xGe_{1-x}$. A gate dielectric stack comprising the low-k material 402 is formed conformal to a top surface of the first isolation region 447 and sides and top of the channel region 413. The first high-k material 437 is formed conformal to the low-k material 402, and the dummy oxide 431 is formed conformal to the first high-k material 437. A dummy gate 401 (e.g., a-Si or p-Si) is formed over the fin and the gate dielectric stack.

Figure 5B:
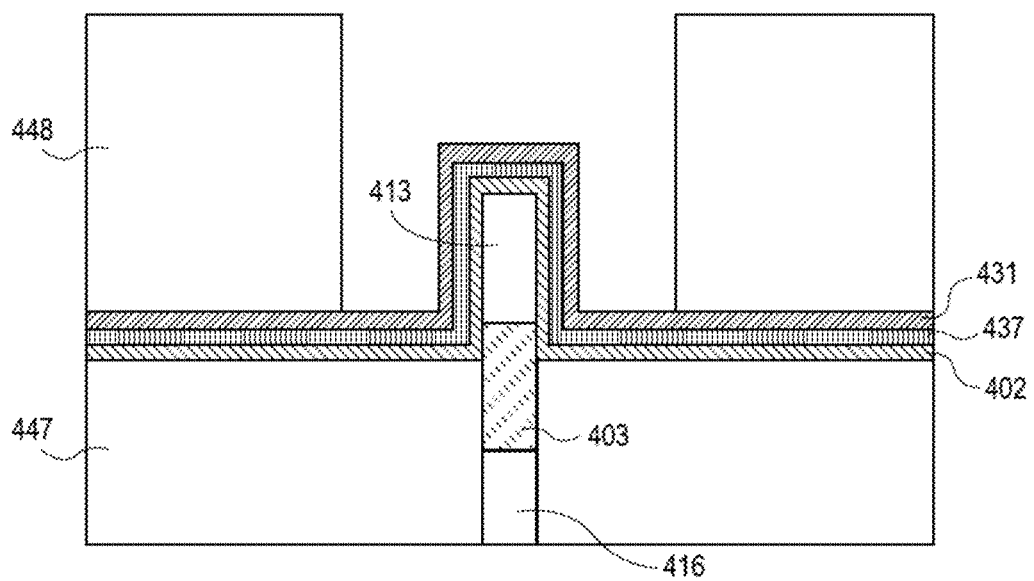

FIG. 5B illustrates the fabrication process during a dummy gate replacement process is performed in which the dummy gate 401 is first removed and then replaced by forming a second isolation region 448 over the top of the gate dielectric stack. The second isolation region 448 is etched to form a trench on each side and over a top the channel region 413. In one embodiment, the width of the channel region 413 may range from 10 to 100 nm and the width of the low-k material 402 may range from 3 to 50 nm.

Figure 5C:
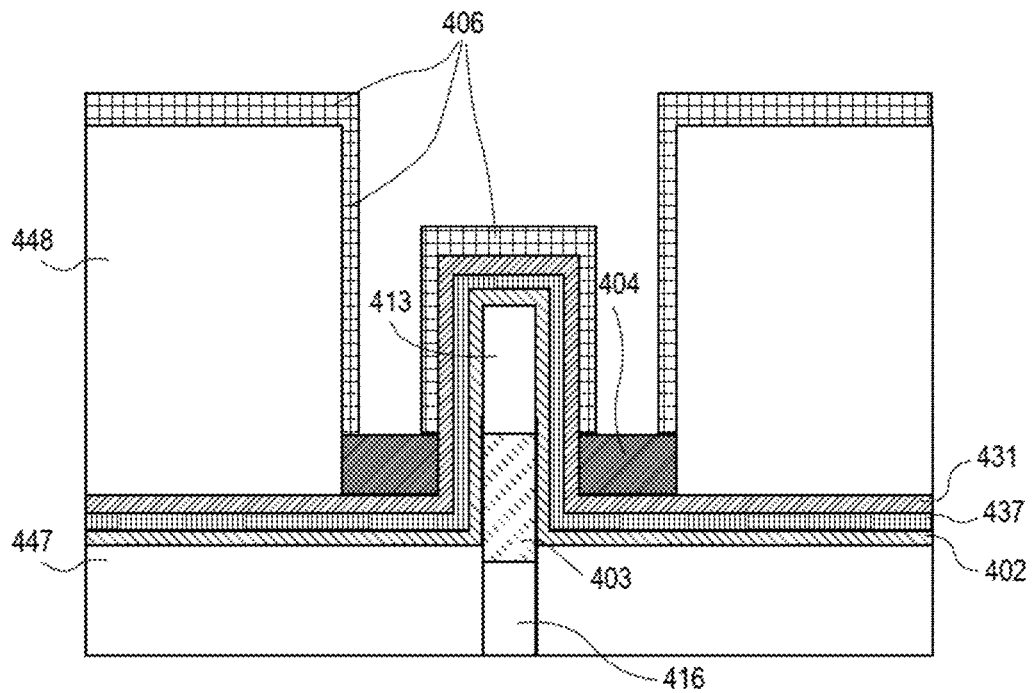

FIG. 5C illustrates the fabrication process after a sacrificial material 404 is deposited in the trench over the gate dielectric stack on either side of the fin, and a non-conformal sacrificial material 406 is deposited over a top and sidewalls of the second isolation region 448 and over a top and sidewalls of the gate dielectric on the channel region 413. In embodiments, the non-conformal sacrificial material 406 is formed with thicker horizontal portions than vertical portions on the sidewalls.

Figure 5D:
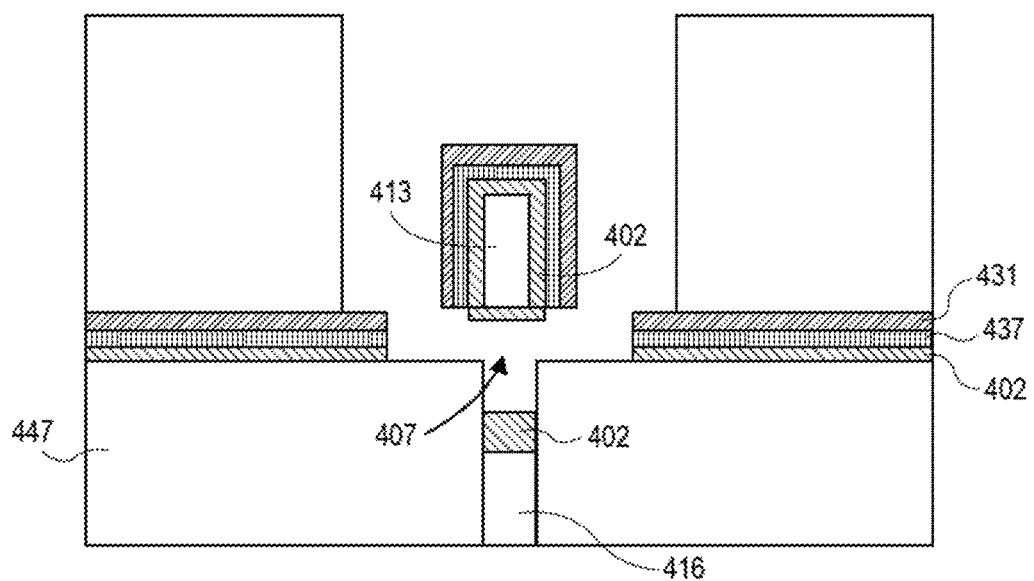

FIG. 5D illustrates the fabrication process after the sacrificial material 404 and the non-conformal sacrificial material 406 are removed from over the gate dielectric stack at the bottom of the trench, but not from the channel region 413. Portions of the gate dielectric stack beneath the sacrificial material 404 and under the channel region 413 are also removed by etching along with the sacrificial layer 403 from the sub-fin region 416. The removal of these materials leaves a cavity 407 between hanging channel region and the sub-fin region.

Figure 5E:
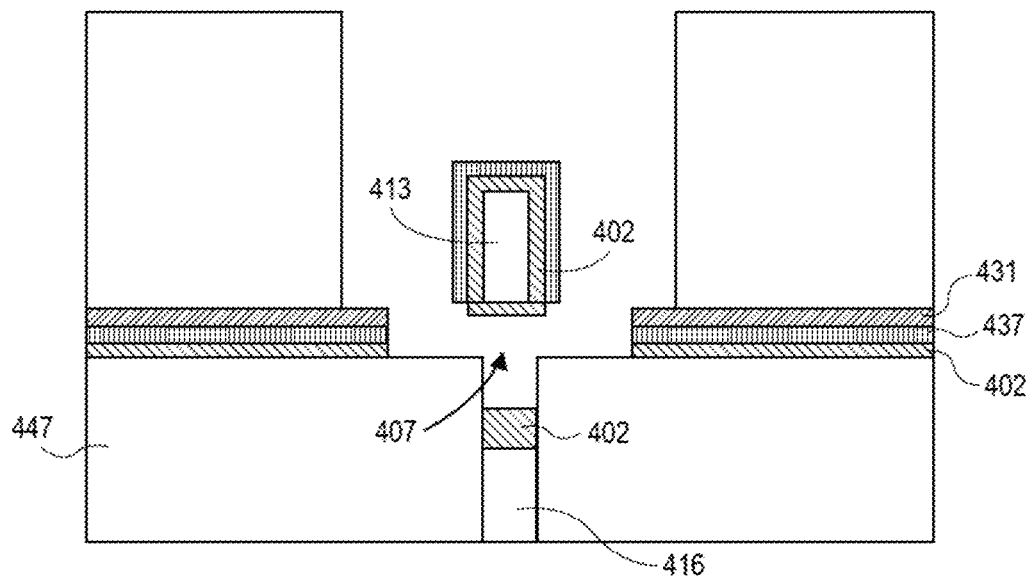

FIG. 5E illustrates the fabrication process after removal of the non-conformal sacrificial material 406 and the dummy oxide 431 from the top and sides of the channel region 413. A top of the sub-fin region 416 is oxidized to form/grow low-k material (e.g., an oxide) 402. Alternatively, an ALD process could be used. The low-k material on the sub-fin region 416 may be the same or different than the low-k material over the first isolation regions 447 and the channel region 413. The presence of the low-k material 402 helps prevent the high-k material from touching the channel material to reduce high-k scattering and to preserve mobility of the channel material.

Figure 5F:
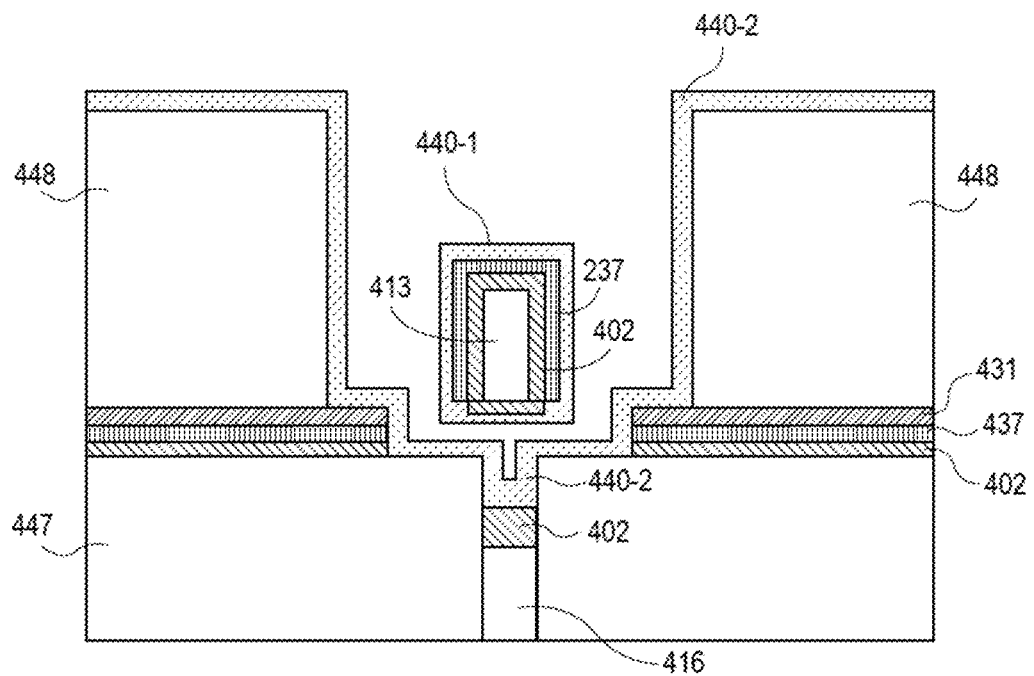

FIG. 5F illustrates the fabrication process after the second high-k material 440-2 is formed conformal to tops and sides of the second isolation region 448 and a bottom of the cavity 407; and after the first high-k material 440-1 is formed conformal to all four sides of the channel region 413.

Referring again to FIG. 4B, the final stage of the fabrication process is shown after the gate electrode 462 is formed in the trench in the second isolation region 448 and in the cavity 407 of the channel region 413 for four sided gate control.

The integrated circuit structures described herein may be included in an electronic device. As an example of one such apparatus, FIGS. 6A and 6B are top views of a wafer and dies that include one or more multilayer high-k gate dielectrics, in accordance with one or more of the embodiments disclosed herein.

Figure 6B:
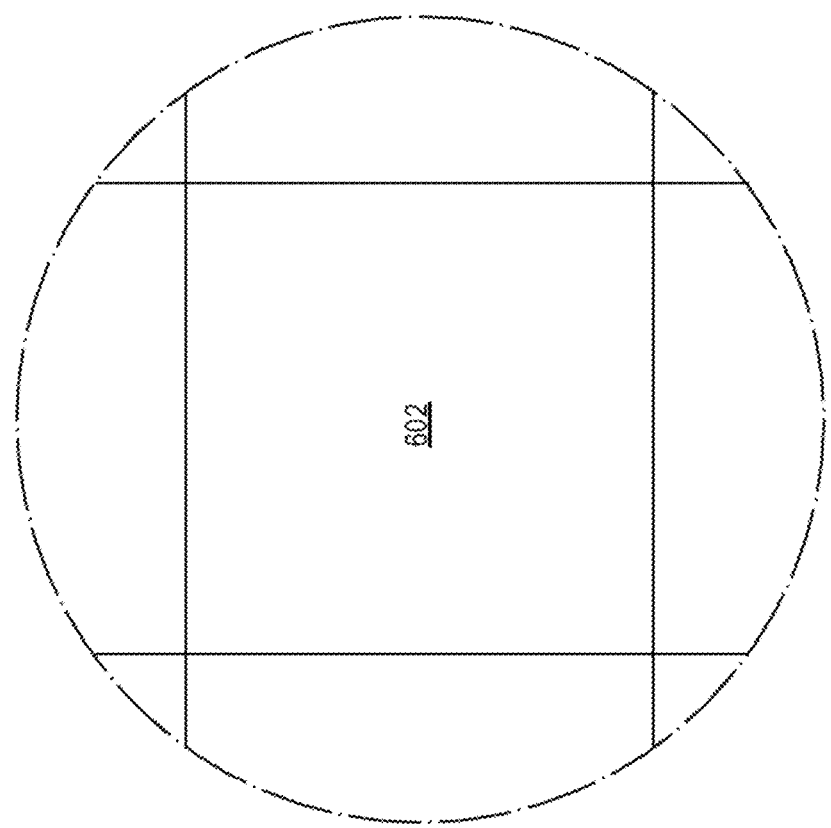
FIGS. 6A and 6B are top views of a wafer and dies that include one or more multilayer high-k gate dielectrics, in accordance with one or more of the embodiments disclosed herein.
Figure 6A:
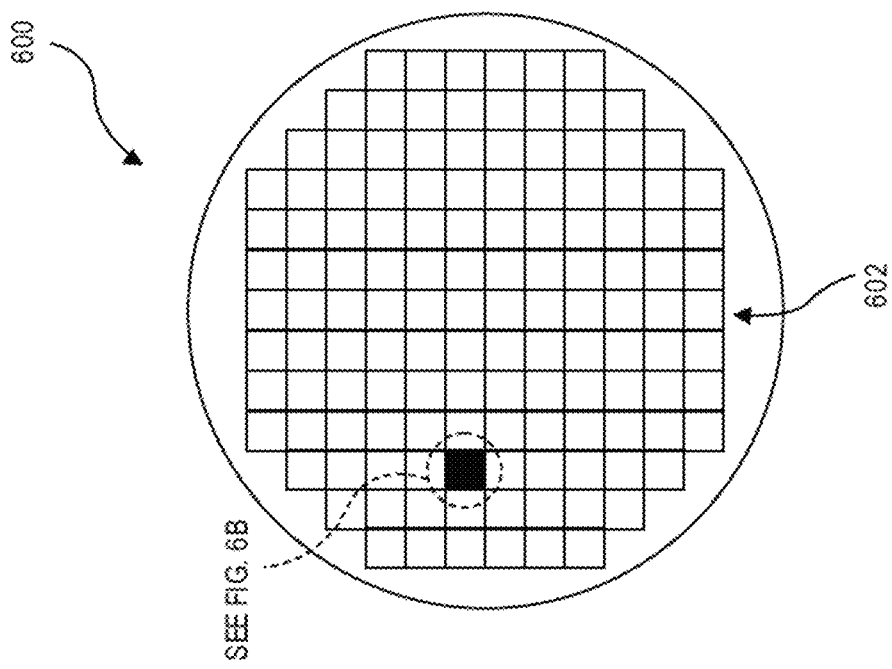

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more multilayer high-k gate dielectrics, such as described above. After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an independently scaled selector as disclosed herein may take the form of the wafer 600 (e.g., not singulated) or the form of the die 602 (e.g., singulated). The die 602 may include one or more embedded non-volatile memory structures based independently scaled selectors and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
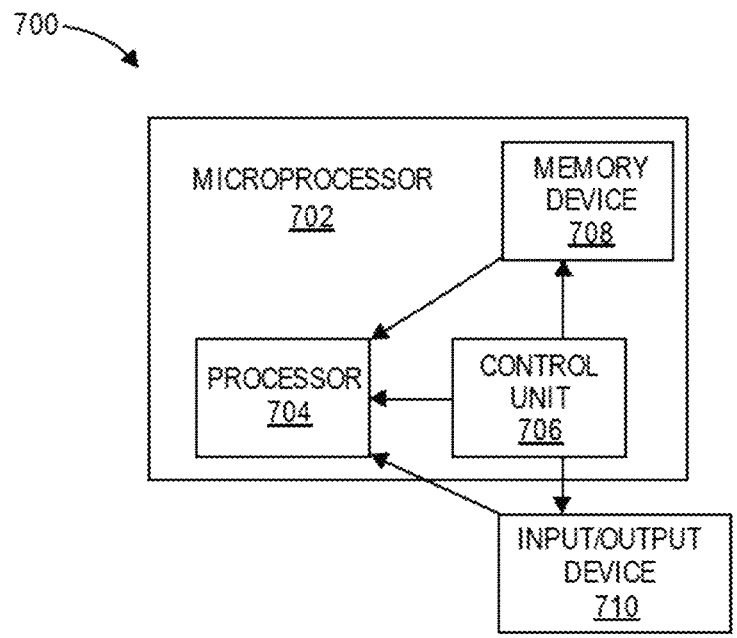
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more multilayer high-k gate dielectrics, such as those described herein.

Figure 8:
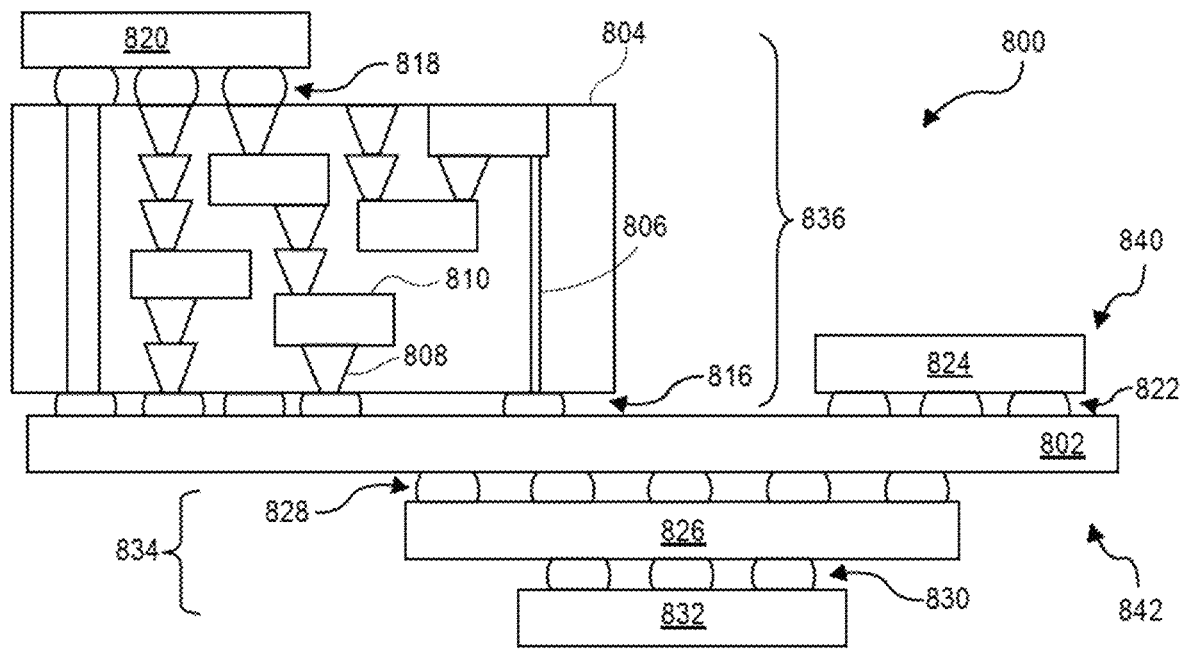
FIG. 8 is a cross-sectional side view of an integrated circuit (IC) device assembly that may include one or more multilayer high-k gate dielectrics, in accordance with one or more of the embodiments disclosed herein.

FIG. 8 is a cross-sectional side view of an integrated circuit (IC) device assembly that may include one or more multilayer high-k gate dielectrics, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of a multilayer high-k gate dielectric, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 602 of FIG. 6B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
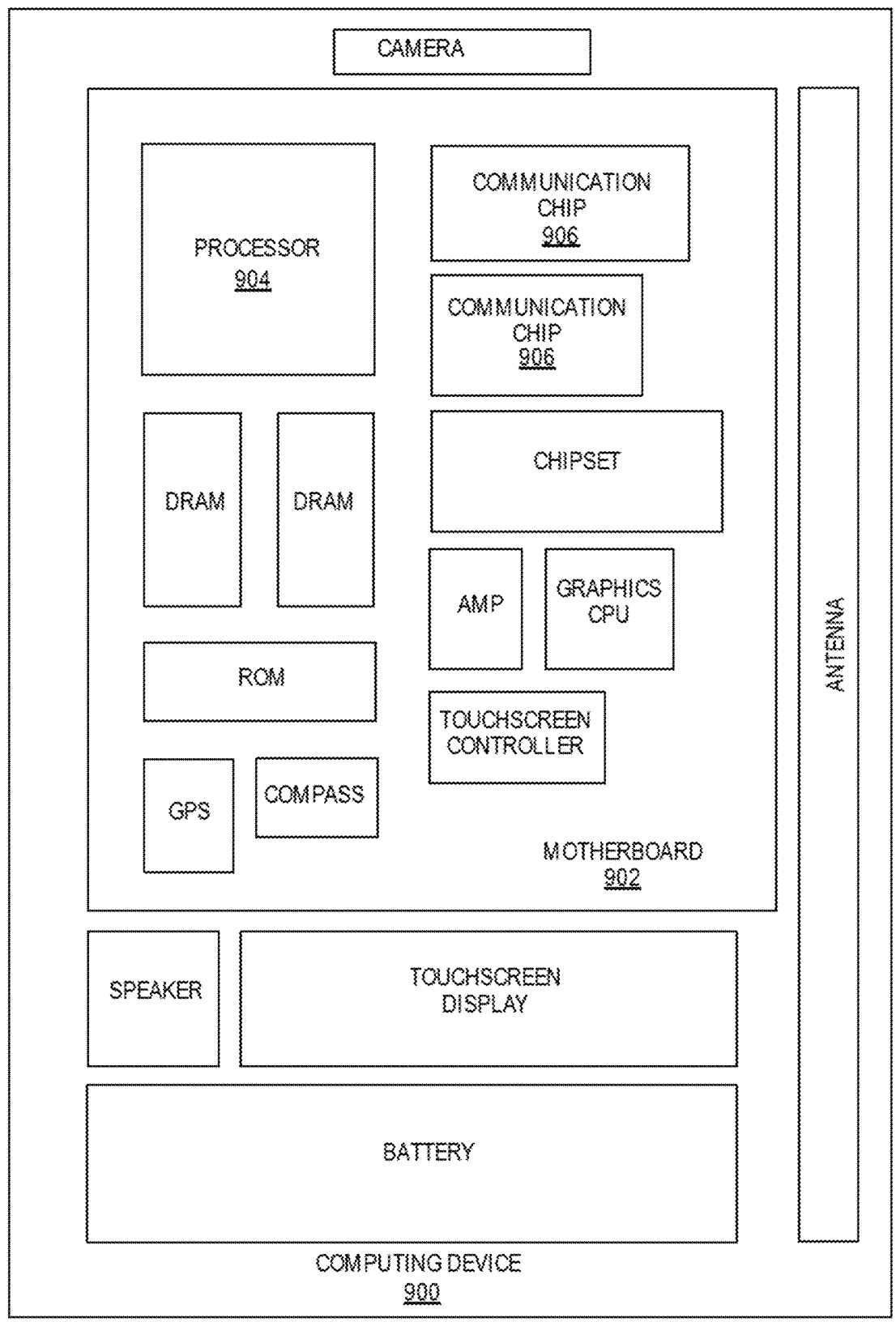
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more multilayer high-k gate dielectrics, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip 906 includes one or more multilayer high-k gate dielectrics, in accordance with implementations of embodiments of the disclosure.

In further implementations, another component housed within the computing device 900 may contain an integrated circuit die that includes one or more multilayer high-k gate dielectrics, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include a multilayer high-k gate dielectric.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure comprises a fin extending from a substrate. The fin comprises source and drain regions and a channel region between the source and drain regions. A multilayer high-k gate dielectric stack comprises at least a first high-k material and a second high-k material, the first high-k material extending conformally over the fin over the channel region, and the second high-k material conformal to the first high-k material, wherein either the first high-k material or the second high-k material has a modified material property different from the other high-k material, wherein the modified material property comprises at least one of ferroelectricity, crystalline phase, texturing, ordering orientation of the crystalline phase or texturing to a specific crystalline direction or plane, strain, surface roughness, and lattice constant. A gate electrode ix over and on a topmost high-k material in the multilayer high-k gate dielectric stack. A selector element is above the metal layer.

Example embodiment 2: The integrated circuit structure of embodiment 1, wherein the crystalline phases include crystalline, polycrystalline, nanocrystalline, and amorphous.

Example embodiment 3: The integrated circuit structure of embodiment 1 or 2, wherein the second high-k material comprises a same material as the first high-k material.

Example embodiment 4: The integrated circuit structure of embodiment 1 or 2, wherein the second high-k material comprises a different material than the first high-k material.

Example embodiment 5: The integrated circuit structure of embodiment 1, 2, 3 or 4, wherein high-k materials used to form the multilayer high-k gate dielectric stack comprise oxygen and a metal, the metal including one or more of aluminum (Al), tantalum (Ta), hafnium (Hf), zirconium (Zr), lanthanum (La), titanium (Ti), magnesium (Mg) or manganese (Mn).

Example embodiment 6: The integrated circuit structure of embodiment 1, 2, 3, 4 or 5, wherein the multilayer high-k gate dielectric stack is approximately 1 to 100 Å in thickness.

Example embodiment 7: The integrated circuit structure of embodiment 1, 2, 3, 4, 5 or 6, further comprising a gate dielectric that extends conformally over the fin over the channel region under the multilayer high-k gate dielectric stack, wherein the gate dielectric has a dielectric constant less than the dielectric constant of materials comprising the multilayer high-k gate dielectric stack.

Example embodiment 8: A method of fabricating an integrated circuit device comprises forming a fin that extends up from a substrate, the fin comprising source and drain regions, and a channel region between the source and drain regions. A multilayer high-k gate dielectric stack is formed comprising at least a first high-k material and a second high-k material, the first high-k material extending conformally over the fin over the channel region, and the second high-k material conformal to the first high-k material, wherein either the first high-k material or the second high-k material has a modified material property different from the other high-k material, wherein the modified material property comprises at least one of ferroelectricity, crystalline phase, strain, texturing, ordering orientation of the crystalline phase or texturing to a specific crystalline direction or plane, surface roughness, and lattice constant. A gate electrode is formed over and on a topmost high-k material in the multilayer high-k gate dielectric stack.

Example embodiment 9: The method of embodiment 8, further comprising: modifying the crystalline phase to be one of crystalline, polycrystalline, nanocrystalline, and amorphous.

Example embodiment 10: The method of embodiment 8 or 9, further comprising: forming the second high-k material to comprise a same material as the first high-k material.

Example embodiment 11: The method of embodiment 8 or 9, further comprising: forming the second high-k material to comprise a different material than the first high-k material.

Example embodiment 12: The method of embodiment 8, 9, 10, or 11, further comprising: forming high-k materials comprising the multilayer high-k gate dielectric stack to comprise oxygen and a metal, the metal including one or more of aluminum (Al), tantalum (Ta), hafnium (Hf), zirconium (Zr), lanthanum (La), titanium (Ti), magnesium (Mg) or manganese (Mn).

Example embodiment 13: The method of embodiment 8, 9, 10, 11 or 12, further comprising: forming the multilayer high-k gate dielectric stack to have a thickness of approximately 1 to 100 Å in thickness.

Example embodiment 14: The method of embodiment 8, 9, 10, 11, 12 or 13, further comprising a gate dielectric that extends conformally over the fin over the channel region under the multilayer high-k gate dielectric stack, wherein the gate dielectric has a dielectric constant less than the dielectric constant of materials comprising the multilayer high-k gate dielectric stack.

Example embodiment 15: An integrated circuit structure comprises a fin extending from a substrate. The fin comprises a hanging fin region, which comprises a channel region, source and drain regions on opposite sides of the channel region, and a sub-fin region under the channel region between the source and drain regions, where the channel region and the sub-fin region are spaced apart. A first isolation region is adjacent both sides the sub-fin region beneath a second isolation region, wherein the second isolation region includes a trench in which the channel region is located. A gate dielectric stack comprises: i) a low-k material conformal to a top surface of the first isolation region and to sides and top of the channel region; ii) a first high-k material conformal to the low-k material over the first isolation region and on sides and top of the channel region; and iii) a second high-k material comprising a first portion and a second portion, wherein the first portion of the second high-k material is over the first high-k material on all four sides of the channel region, and the second portion of the second high-k material is conformal to a top surface of the second isolation region, conformal to sides and bottom of the trench, and conformal to a top of the sub-fin region. A gate electrode fills the trench and surrounds the second portion of the second high-k material around a perimeter of the channel region.

Example embodiment 16: The integrated circuit structure of embodiment 15, wherein the first high-k material and the second high-k material comprise a multilayer high-k gate dielectric stack.

Example embodiment 17: The integrated circuit structure of embodiment 15 or 16, wherein either the first high-k material or the second high-k material has a modified material property different from the other high-k material, wherein the modified material property comprises at least one of ferroelectricity, crystalline phase, strain, surface roughness, and lattice constant.

Example embodiment 18: The integrated circuit structure of embodiment 17, wherein the crystalline phases include crystalline, polycrystalline, nanocrystalline, and amorphous.

Example embodiment 19: The integrated circuit structure of embodiment 15, 16, 15 17 or 18, wherein the second high-k material comprises a same material as the first high-k material.

Example embodiment 20: The integrated circuit structure of embodiment 15, 16, 15 17, 18 or 19, wherein the second high-k material comprises a different material than the first high-k material.

Example embodiment 21: The integrated circuit structure of embodiment 15, 16, 15 17, 18, 19 or 20, wherein the low-k material is further on top of the sub-fin region.

Example embodiment 22: The integrated circuit structure of embodiment 15, 16, 15 17, 18, 19, 20 or 21, wherein the gate dielectric stack further includes a dummy oxide conformal to the first high-k material over the first isolation region and over the sides and top of the channel region.

Example embodiment 23: The integrated circuit structure of embodiment 15, 16, 15 17, 18, 19, 20, 21 or 22, wherein the integrated circuit structure comprises a gate all around transistor.

Example embodiment 24: A method of forming an integrated circuit, comprises forming a fin extending from a substrate. The fin comprises a hanging fin region comprising a channel region, source and drain regions on opposite sides of the channel region, and a sub-fin region under the channel region between the source and drain regions, where the channel region and the sub-fin region are spaced apart A first isolation region is formed adjacent both sides the sub-fin region beneath a second isolation region, wherein the second isolation region includes a trench in which the channel region is located. A gate dielectric stack is formed comprising: i) a low-k material conformal to a top surface of the first isolation region and to sides and top of the channel region; ii) a first high-k material conformal to the low-k material over the first isolation region and on sides and top of the channel region; and iii) a second high-k material comprising a first portion and a second portion, wherein the first portion of the second high-k material is over the first high-k material on all four sides of the channel region, and the second portion of the second high-k material is conformal to a top surface of the second isolation region, conformal to sides and bottom of the trench, and conformal to a top of the sub-fin region. A gate electrode is formed to fill the trench and surround the second portion of the second high-k material around a perimeter of the channel region.

Example embodiment 25: The method of embodiment 24, wherein either the first high-k material or the second high-k material has a modified material property different from the other high-k material, wherein the modified material property comprises at least one of ferroelectricity, crystalline phase, strain, surface roughness, and lattice constant.

What is claimed is:

1. An integrated circuit structure, comprising:
    a fin extending from a substrate, the fin comprising a hanging fin region, which comprises a channel region, source and drain regions on opposite sides of the channel region, and a sub-fin region under the channel region between the source and drain regions, where the channel region and the sub-fin region are spaced apart;
    a first isolation region adjacent both sides the sub-fin region beneath a second isolation region, wherein the second isolation region includes a trench in which the channel region is located;
    a gate dielectric stack, comprising: i) a low-k material conformal to a top surface of the first isolation region and to sides and top of the channel region; ii) a first high-k material conformal to the low-k material over the first isolation region and on sides and top of the channel region; and iii) a second high-k material comprising a first portion and a second portion, wherein the first portion of the second high-k material is over the first high-k material on all four sides of the channel region, and the second portion of the second high-k material is conformal to a top surface of the second isolation region, conformal to sides and bottom of the trench, and conformal to a top of the sub-fin region; and
    a gate electrode fills the trench and surrounds the second portion of the second high-k material around a perimeter of the channel region.

2. The integrated circuit structure of claim 1, wherein the first high-k material and the second high-k material comprise a multilayer high-k gate dielectric stack.

3. The integrated circuit structure of claim 2, wherein either the first high-k material or the second high-k material has a modified material property different from the other first high-k material or the second high-k material, wherein the modified material property comprises at least one of ferroelectricity, crystalline phase, strain, surface roughness, and lattice constant.

4. The integrated circuit structure of claim 3, wherein the crystalline phase include crystalline, polycrystalline, nanocrystalline, and amorphous.

5. The integrated circuit structure of claim 1, wherein the second high-k material comprises a same material as the first high-k material.

6. The integrated circuit structure of claim 1, wherein the second high-k material comprises a different material than the first high-k material.

7. The integrated circuit structure of claim 1, wherein the low-k material is further on top of the sub-fin region.

8. The integrated circuit structure of claim 1, wherein the gate dielectric stack further includes a dummy oxide conformal to the first high-k material over the first isolation region and over the sides and top of the channel region.

9. The integrated circuit structure of claim 1, wherein the integrated circuit structure comprises a gate all around transistor.

10. A method of forming an integrated circuit, comprising:
    forming a fin extending from a substrate, the fin comprising a hanging fin region comprising a channel region, source and drain regions on opposite sides of the channel region, and a sub-fin region under the channel region between the source and drain regions, where the channel region and the sub-fin region are spaced apart;
    forming a first isolation region adjacent both sides the sub-fin region beneath a second isolation region, wherein the second isolation region includes a trench in which the channel region is located;
    forming a gate dielectric stack, comprising: i) a low-k material conformal to a top surface of the first isolation region and to sides and top of the channel region; ii) a first high-k material conformal to the low-k material over the first isolation region and on sides and top of the channel region; and iii) a second high-k material comprising a first portion and a second portion, wherein the first portion of the second high-k material is over the first high-k material on all four sides of the channel region, and the second portion of the second high-k material is conformal to a top surface of the second isolation region, conformal to sides and bottom of the trench, and conformal to a top of the sub-fin region; and forming a gate electrode to fill the trench and surround the second portion of the second high-k material around a perimeter of the channel region.

11. The method of claim 10, wherein either the first high-k material or the second high-k material has a modified material property different from the other first high-k material or the second high-k material, wherein the modified material property comprises at least one of ferroelectricity, crystalline phase, strain, surface roughness, and lattice constant.

\* \* \* \* \*